United States Patent [19]

Fujita

[11] Patent Number: 5,387,878
[45] Date of Patent: Feb. 7, 1995

[54] AMPLIFICATION CIRCUIT

[75] Inventor: Shinichi Fujita, Hamamatsu, Japan

[73] Assignee: Yamaha Corporation, Japan

[21] Appl. No.: 67,845

[22] Filed: May 27, 1993

[30] Foreign Application Priority Data

May 29, 1992 [JP] Japan .................................. 4-163732
May 6, 1993 [JP] Japan .................................. 5-127746

[51] Int. Cl.[6] ............................................ H03F 3/26
[52] U.S. Cl. ..................................... 330/265; 330/271
[58] Field of Search ............... 330/270, 265, 255, 271, 330/272, 294

[56] References Cited

U.S. PATENT DOCUMENTS 4,922,208 5/1990 Susak et al. .................... 330/270

FOREIGN PATENT DOCUMENTS 54-12031 5/1979 Japan .
1497712 7/1989 U.S.S.R. .................... 330/265

*Primary Examiner*—James B. Mullins
*Assistant Examiner*—James A. Dudek
*Attorney, Agent, or Firm*—Graham & James

[57] ABSTRACT

An amplification circuit includes a push-pull type output circuit including first and second output transistors operating complimentarily connected in series between dc current source terminals, the bases of the first and second transistors being driven by a pre-stage output, a current detecting resistance inserted between either one of the first and second transistors and the dc current source terminals for detecting a bias current of the output circuit, an error amplification circuit for amplifying difference between voltage across the current detecting resistance and reference voltage and for negative-feedback controlling the bias current of the output circuit, and a diode connected in parallel to the current detecting resistance for bypassing a current flowing during outputting of a signal. The amplification circuit may further include a distortion reduction circuit for charging and holding the voltage across the current detecting resistance at its lowest state and thereby smoothing the output current of the error amplification circuit during outputting of a signal. A push-pull type amplification circuit in which deterioration in characteristics is not caused and adjustment of an idling current and temperature compensation are not required is thereby provided.

4 Claims, 8 Drawing Sheets

AMPLIFICATION CIRCUIT

BACKGROUND OF THE INVENTION

This invention relates to a push-pull amplification circuit, particularly to a bias stabilizing technique for an output circuit section thereof.

An output stage of general power amplifiers of push-pull type has a configuration as shown in FIG. 9. An npn transistor Q11 and a pnp transistor Q12 are output transistors, and a bias circuit consisting of resistances RB1, RB2 and an npn transistor Q13 is provided in order to supply them with a predetermined bias. A base-base voltage VBB of the output stage transistors Q11 and Q12 is determined by setting a ratio of the resistances RB1 and RB2, whereby an idling current is determined.

In such a prior art power amplifier output stage configuration, it is necessary to provide a heat coupling of the biasing transistor Q13 with the output stage transistors Q11 and Q12 in order to prevent a heat trouble caused by a heat generation of the transistors Q11 and Q12, that decreases base-emitter voltage (VBE) of the transistors resulting in the current increase. Emitter resistance RE of the output stage transistors Q11 and Q12 have a negative feedback function against the increase in current of these transistors. Since, however, in general power amplifiers, each of emitter resistance RE has an extremely small value of 1 ohm or below, the current can be remarkably affected by a small change in the bias voltage and base-emitter voltage VBE. Therefore, in general, the heat coupling as described above is regarded to be indispensable.

As the idling current can also be largely affected by irregularity in element characteristics, the bias resistances RB1 and RB2 should not be fixed, but be adjustable. For example, in case that output transistors are replaced, readjustment of the bias resistances RB1 and RB2 is required.

Moreover, in order to provide the heat coupling of the bias transistor Q13 with the output transistors Q11 and Q12, it is necessary to locate the bias transistor Q13 on heat radiators for the output transistors Q11 and Q12, for which a special structural arrangement are required.

In order to solve these problems as described above, a technique as shown, for example, in the FIGS. 3 and 4 of the Japanese Patent Publication No. Sho 54-12031 is proposed, in which the base bias of the output transistors is control led by detecting voltage across emitter resistance RE of the output transistors.

However, the resistances RE inserted between the emitters of the output transistors of push-pull type which are originally designed for achieving an operation balance have a very small value of 1 ohm or less. Accordingly, in case of a small current operation, different from a case of large amplitude operation, change in a detected voltage by the emitter resistance is extremely small and, therefore, it is difficult to secure accuracy in bias control. Further, it is problematical to increase the emitter resistance RE in order to increase the detected voltage, because output impedance of the amplifier is increased.

As described above, there are problems in the conventional output stage configuration of general power amplifiers, that adjustment of idling is required, temperature compensation by the heat coupling is indispensable, and that some structural arrangement for them is needed. In the method in which the bias control is made by the voltage across emitter resistance of the output transistors, it is difficult to perform an accurate control, and if the emitter resistance is to be increased to realize an accurate control, it results in deterioration of the amplifier characteristics such as increase in the output impedance.

This invention aims at offering an push-pull amplification circuit, which does not cause deterioration of characteristic or require the idling adjustment or the temperature compensation.

SUMMARY OF THE INVENTION

For achieving the object of the invention, an amplification circuit according to the invention comprises a push-pull type output circuit including first and second output transistors operating complimentarily connected in series between dc current source terminals, bases of said first and second transistors being driven by a pre-stage output, a current detecting resistance inserted between either one of said first and second transistors and one of said dc current source terminals for detecting a bias current of said output circuit, error amplification means for amplifying difference between voltage across said current detecting resistance and reference voltage and for negative-feedback controlling the bias current of said output circuit, and a diode connected in parallel to said current detecting resistance for bypassing a current flowing during outputting of a signal.

According to the invention, resistance for detecting an idling current is located on a power source side of the output transistor, a bias current is automatically negative-feedback controlled by utilizing an error amplification between the voltage across emitter resistance and a reference voltage and, therefore, the idling adjustment and the temperature compensation are not required. As the resistance for detecting an idling current is connected in parallel with the diode for by-passing current during production of signals, increase in power loss and decrease in output signal amplitude generated by providing the resistance on the power side are held to an insignificant degree. This addition of the by-passing diode is permissible because detection of the idling current is not needed during production of a signal, when a large current flows through the output transistor. Also, compared with prior art method, in which the idling current detection is performed by resistance on the side of output terminal of the output transistor, even when a value of resistance for currency detection is increased, such deterioration in characteristics of the output impedance is not caused.

When such bias current control by feedback as described above is performed, it causes some decrease in distortion characteristic. This is because a load current flows also through the resistance for the current detection when signals are produced with a load, and the transistor used for the error amplification is cut off every half wave.

In one aspect of the invention, there is provided an amplification circuit comprising push-pull type output circuit means for complimentarily operating and outputting a signal, said push-pull type output means connecting in series between dc current source terminals, bases of said first and second transistors being driven by an output of pre-stage of said push-pull type output means, current detecting means for detecting a bias current of said output means between said first transistor and one of said dc current source terminals, the dc current source terminal being located nearer to said first transistor than to said second transistor, error amplification means for amplifying difference between voltage detected by said current detecting means and reference voltage and for negative-feedback controlling the bias current of said output means, and a diode connected in parallel to said current detecting means for bypassing a current flowing when said push-pull type output means outputs a signal.

According to this aspect of the invention, distortion is reduced by providing means for charging and holding the voltage across the current detecting resistance at its lowest value and, thereby smoothing the output current of the error amplification means when producing signals.

DESCRIPTION OF PREFERRED EMBODIMENTS

Preferred embodiments of this invention will be described below with reference to the accompanying drawings.

Figure 1:
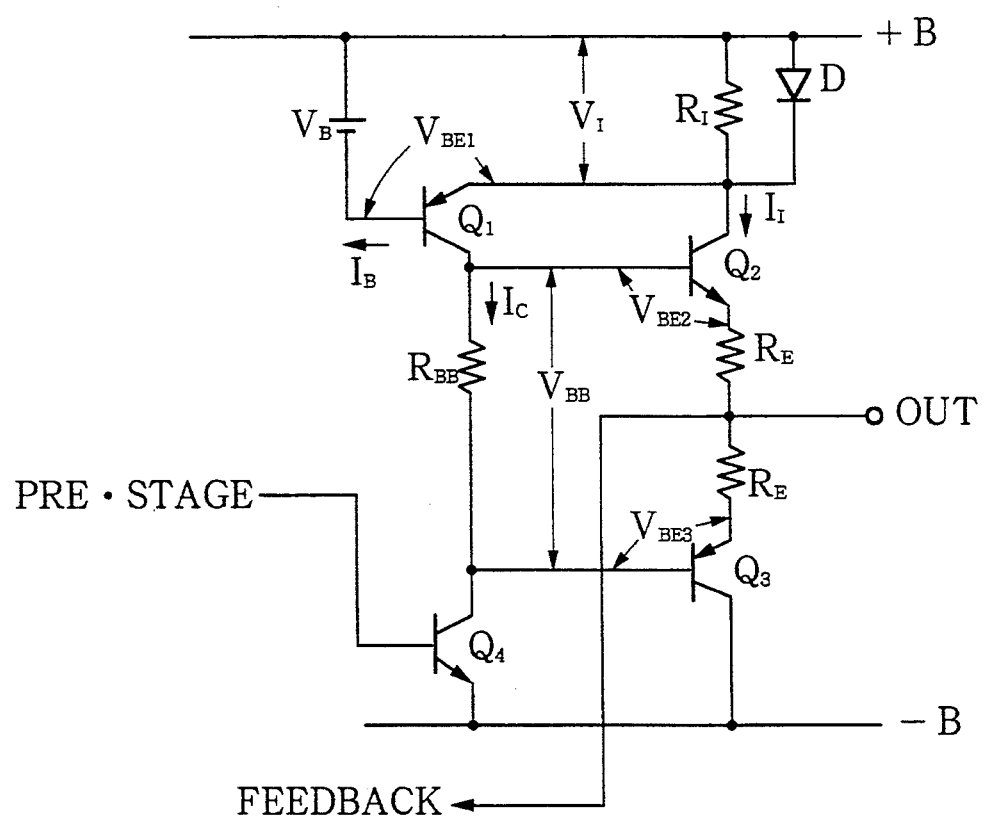
FIG. 1 is a diagram showing a main part of the amplification circuit according to the first embodiment of this invention.

FIG. 1 shows the main part of the amplification circuit according to the first embodiment. A first output transistor Q2 and a second output transistor Q3 are connected in series between a positive power source terminal +B and a negative power source terminal −B to constitute a push-pull type output circuit. In this embodiment, the first output transistor Q2 is an npn transistor, and the second output transistor Q3 is a pnp transistor. The emitters of these two output transistors Q2 and Q3 are respectively connected to an output terminal OUT through a small emitter resistance RE. Between a collector of the transistor Q2 and the positive power source terminal +B in this embodiment, current detecting resistance RI is inserted. A bypassing diode D is connected in parallel to this current detecting resistance RI.

A base of the output transistor Q3 is connected to a collector of the output transistor Q4 of a pre-drive circuit, and a biasing resistance RBB is connected between bases of the output transistors Q3 and Q2.

A pnp transistor Q1, in which the emitter is connected to the collector of the output transistor Q2, and the collector to the base thereof, is a transistor constituting an error amplification circuit for controlling bias current of the output circuit by the voltage across the current detecting resistance R1. Between the base of the transistor Q1 and the positive power source terminal +B, a reference voltage source Vs is provided. The transistor Q1 amplifies the difference between the reference voltage source and the voltage across the current detecting resistance RI and the amplified difference is fed back to the output transistors Q2 and Q3 as a change of the voltage across a bias resistance RBB to perform the bias control.

An outline of the operation of this amplification circuit will now be described. As shown in FIG. 1, it is supposed that an idling current II flows in an output circuit. At this moment, a current Ic flows through the transistor Q1 in accordance with the difference between the voltage generated across the current detecting resistance RI and the reference voltage VB. Change of this current Ic becomes a change in the bias voltage VBB between bases of the output transistors Q2 and Q3 by the bias resistance RBB, and is fed back by the change of the current II. That is, when the idling current II becomes smaller and VI=RI·II becomes smaller, a forward bias of the transistor Q1 become larger and therewith the current IC increases. As a result, the feedback control is performed so that the bias voltage VBB increases and the idling current II increases. Therefore, the part of the transistor Q1 constitutes a constant voltage circuit for making the idling current II constant by the error amplification.

The above described operation will be described more specifically by using formulas. The voltage VI across the current detecting resistance RI, when the base-emitter voltage of the transistor Q1 is VBE1, is $$VI = VB - VBE1 \quad (1)$$

In the meanwhile, assuming that the idling current is II, the base current of the transistor Q1 is IB, and the collector current is IC $$VI = RI(II + IC + IB) \quad (2)$$

If the idling current I1 is sufficiently larger than the collector current IC, and the base current IB is sufficiently smaller than the collector current IC, the base current IB can be ignored, and the formula (1) and (2) make $$VB - VBE1 = RI(II + IC) \quad (3)$$

Since the left part of the formula (3) is constant, when the idling current II increases, the collector current IC decreases. On the other hand, assuming that the base-emitter voltage of output transistors Q2 and Q3 are VBE2 and VBE3 respectively, relation between IC an II is $$II = \{RBB \cdot IC - (VBE2 + VBE3)\}/2RE \quad (4)$$

and the control, in which the idling current II is decreased in accordance with a decrease in the collector current IC, performed.

In the formula (4), as VBE2, VBE3 and RE are included in the same feedback group, their error, irregularity and temperature characteristics can be ignored.

The current detecting resistance RI requires a value of some ohms to some decades ohms in order to detect an idling current of some decades miliamperes. Supposing that only this current detecting resistance RI is provided between the transistor Q2 and the power source terminal, a large load current of some amperes flows in this current detecting resistance RI, when a load is connected to the output terminal OUT to produce signals. This means increase in power loss and insufficient amplitude in the output. The bypassing diode D, therefore, is provided to avoid these problems in signal outputting. Since idling current detection is not needed while a large current flows, there is no problem for the idling current control if the diode D is connected as shown.

Change in the collector current IC of the transistor Q1 for differential amplification does not directly affect potential of the output terminal OUT. The potential of the output terminal is made constant at about O V by a feedback as a whole.

Figure 2:
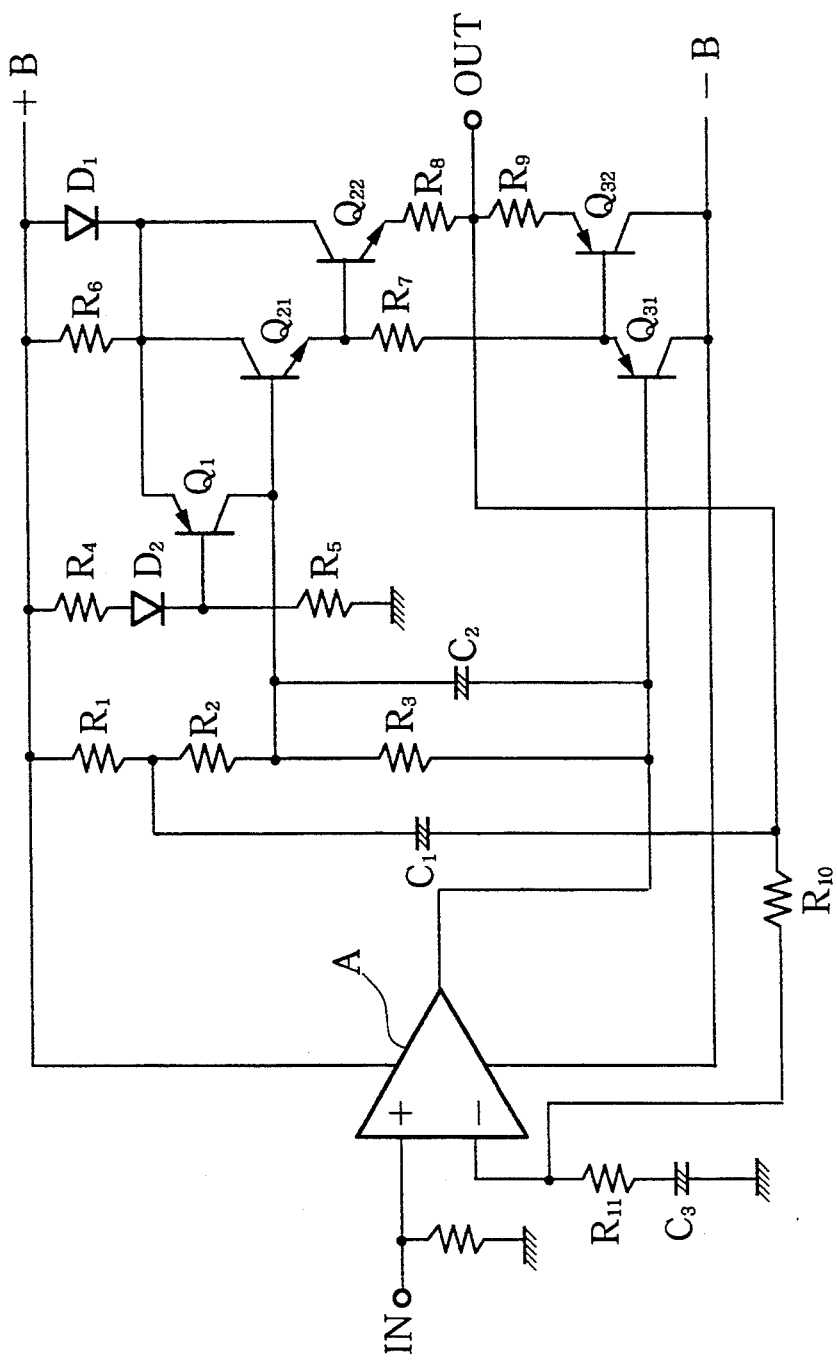
FIG. 2 is a diagram showing a specific circuit of the above embodiment.

FIG. 2 is a specific amplification circuit of the embodiment of FIG. 1. Two transistors, Q21 and Q22, which are connected in Darlington connection, are used for the part of the first output transistor Q2 in FIG. 1 and, in the same way, two transistors Q31 and Q32, which are connected in Darlington connection, are used for the part of the second output transistor Q3. Between collectors of the transistors Q21 and Q22 and the positive side power source terminal +B, a current detecting resistance R6 correspondent to the current detecting resistance RI of FIG. 1 is inserted, with which the bypassing diode D is connected in parallel connection.

The reference voltage VB given to the base of the error amplification transistor is obtained by dividing a voltage by resistances R4 and R5. A diode D2 is used for temperature compensation of the base-emitter voltage VBE of the output transistor Q1. A resistance R3 corresponds to the base bias resistance RBB of FIG. 1.

The collector of the transistor Q1 is connected to the positive side power source terminal +B through the resistances R2 and R1. These resistance R2 and R1 are provided to increase the ratio between the idling current II and the collector current IC of the transistor Q1, i.e., to reduce the collector current IC. These resistance R2 and R1 may be not necessarily provided. The base bias resistance R3 is provided with stabilizing capacitor C2, and between a connection node of the resistance R1 and R2 and the output terminal OUT, a boot strapping capacitor C1 is provided. These may not necessarily be provided either.

A signal at the output terminal OUT is fed back to a negative input terminal of the pre-drive circuit A by a feedback circuit having resistance R10 and R11, as illustrated, for sake of stabilization of output.

In this circuit, if, for example, the idling current is set at 15 mA and the value of the current detecting resistance R6 is 10 ohms, the voltage across the current detecting resistance R6 becomes 150 mV. As the base-emitter voltage VBE of the error amplification transistor Q1 and forward voltage drop VF of the diode D2 cancels each other, the ratio between the resistances R4 and R5 should be so set that the voltage across the resistance R4 becomes 150 mV. This setting can be easily made without any adjustment, even when an actual error of resistances is taken into consideration. Considering the irregularity of quality of the diode D2 and the transistor Q1, the error can be controlled by using dual transistors in this part.

Conversely, even if a slight fluctuation is allowed of the diode D2 is ommited, rise in temperature of the error amplification transistor Q1 does not easily cause a heat trouble. For example, when the rise in temperature $\Delta T = 75°$ C., the base-emitter voltage VBE of the transistor Q1 decreases by about 150 mV. Thereby voltage across the current detecting resistance R6 becomes about 300 mV and, accordingly, the idling current becomes 30 mA. However, this increase in the current only causes a slight increase in heat generation of the output transistors Q22 and Q32, and it does not cause the transistor Q1 to generate heat by itself, and the idling current is stabilized.

Figure 5:
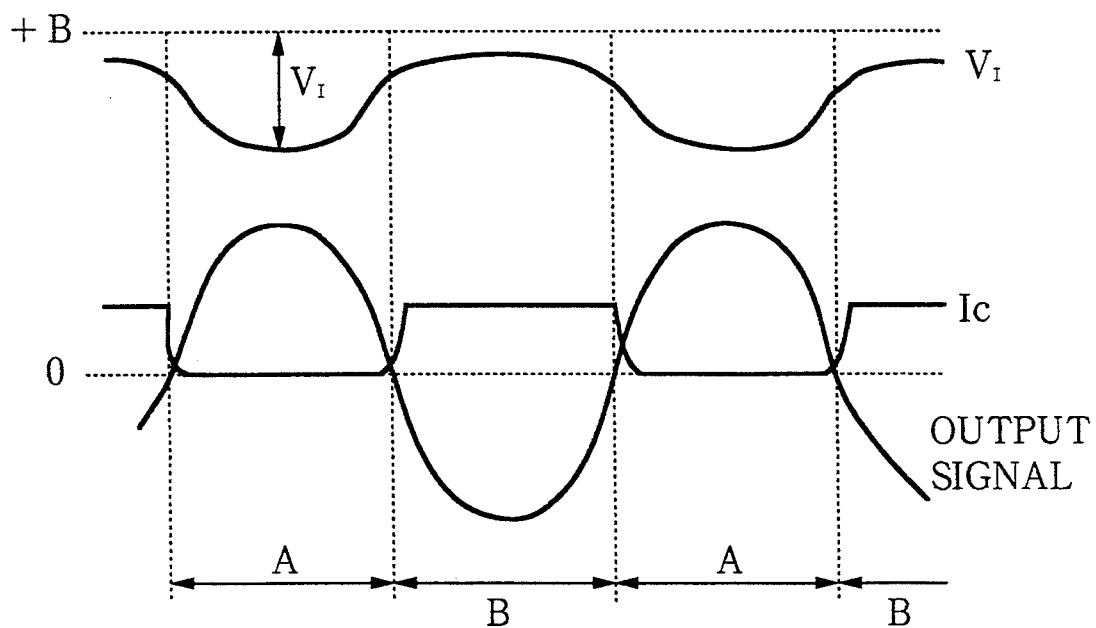
FIG. 5 is a waveform diagram explaining an operation of the embodiment of FIG. 1.

Although the above described embodiment is sufficient for an idling current control, distortion characteristics of the output circuit becomes somewhat deteriorated. This because, when a signal is delivered out with the output terminal OUT loaded, a load current flows through the current detecting resistance R6 and even if it is clamped by the diode D1, the voltage across the current detecting resistance R6 VI becomes higher than the reference voltage VB, and the error amplification transistor Q1 is cut off. This is shown in FIG. 5.

During the part A where the output signal is a positive half wave, a big load current flows and even if it is clamped by the diode D1, the voltage VI across the current detecting resistance R6 is still higher than the reference voltage VB. At this moment, the error amplification transistor Q1 always operates to decrease collector current to be cut off as a result. During the period B, where the output signal is a negative half wave, the load current flows through the negative side output transistors Q31 and Q32, and the positive side output transistors Q21 and Q22 tend to cut off but, when the voltage across the current detecting resistance R6 becomes lower than the reference voltage VB, the error amplification transistor Q1 tends to increase the idling current II by increasing the collector current.

As the error amplification transistor Q1 is positioned on the input side when seen from the output stage transistor, the above described cutoff of the same transistor occurring every half wave (the period A) of the signal generates a considerable switching distortion. This distortion cannot be removed even in the same feedback group due to its characteristics and remains as a distortion of the output signal.

Figure 3:
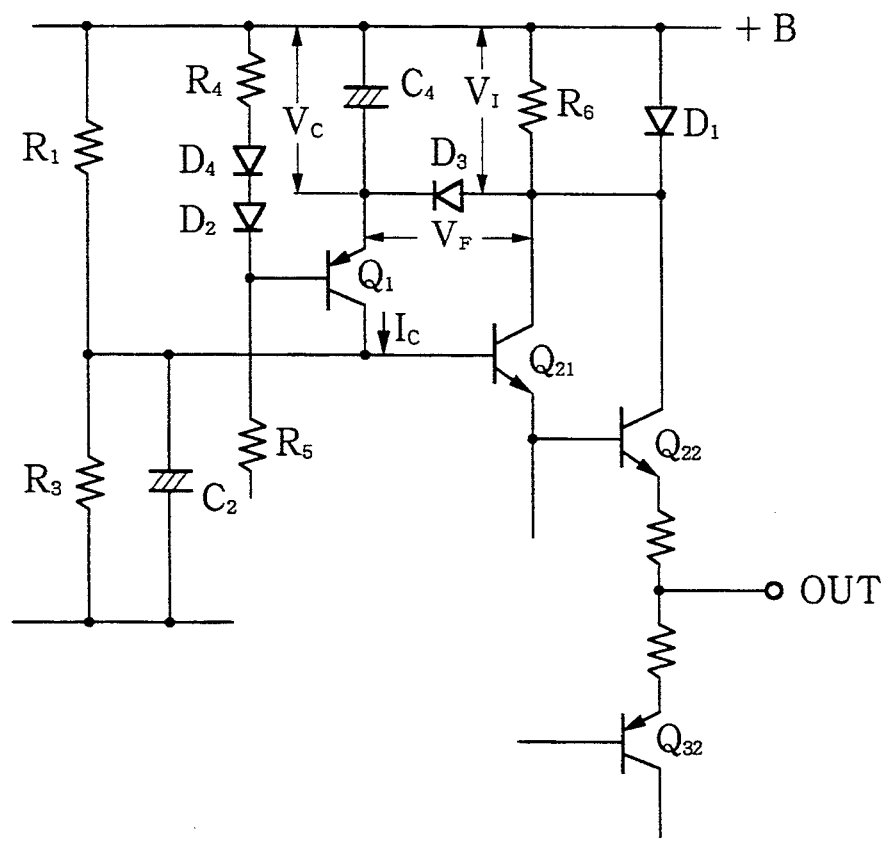
FIG. 3 is a diagram showing a main part of the amplification circuit according to the second embodiment of this invention.

An embodiment to solve such problem will now be explained. FIG. 3 shows construction of a main part of this embodiment. It shows a part, which is added to the circuit construction of the embodiment of FIG. 2. That is, a diode D3 is inserted between the current detecting resistance R6 and the emitter of the transistor Q1, and a capacitor C4 is provided between the emitter of the transistor Q1 and the positive source terminal +B. Further, in accordance with the addition of the diode D3 to the emitter, a diode D4 is added also on the base side for the temperature compensation.

The Diode D3 and the capacitor C4 constitute a circuit for reducing distortion by maintaining the collector current IC of the error amplification transistor Q1 stable even when producing signals.

Figure 6:
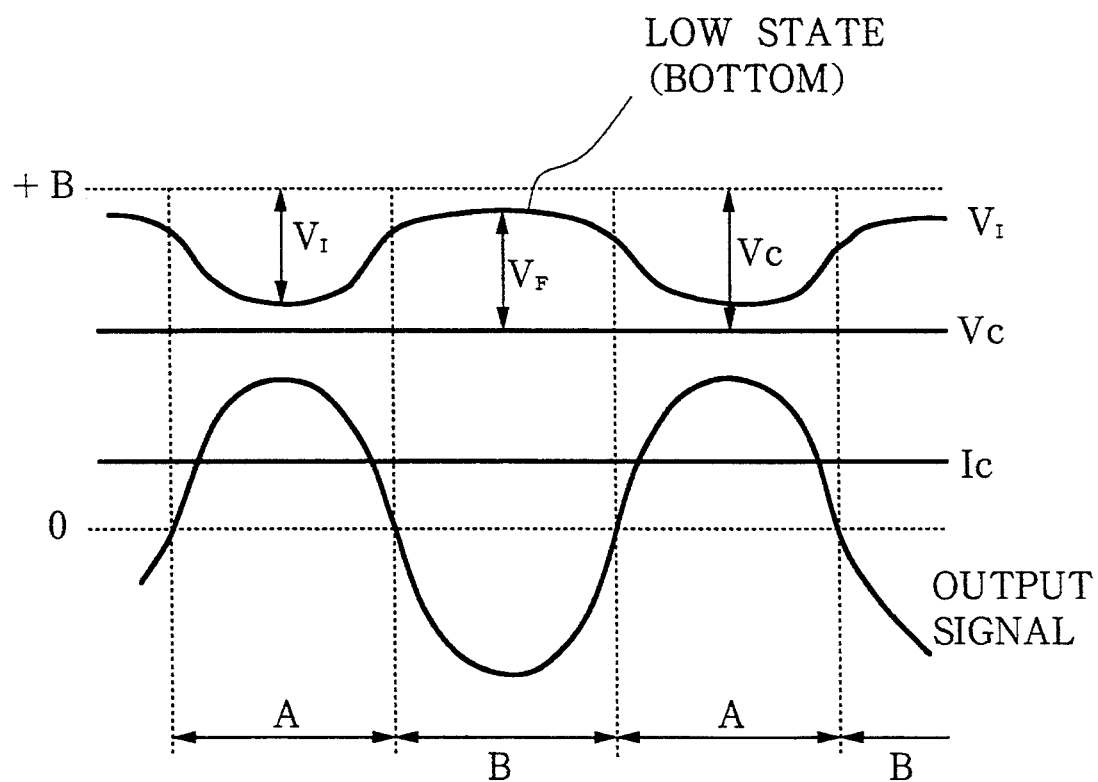
FIG. 6 is a waveform diagram explaining an operation of the embodiment of FIG. 3.

That is, as shown in FIG. 6, the capacitor C4 is charged with current flowing in a state where detected voltage VI by the current detecting resistance R6 is at the bottom and, when the detected voltage VI becomes high, the diode D3 becomes a reverse bias. Thereby, the voltage VC held in the capacitor C4 becomes a substantially constant value, and the current flows with the constant value and does not cause such a cutoff as shown in FIG. 5 every half wave. Accordingly, it is avoided that the transistor Q1 becomes a source of the switching distortion and, as a result, distortion of the output signal is reduced.

Figure 4:
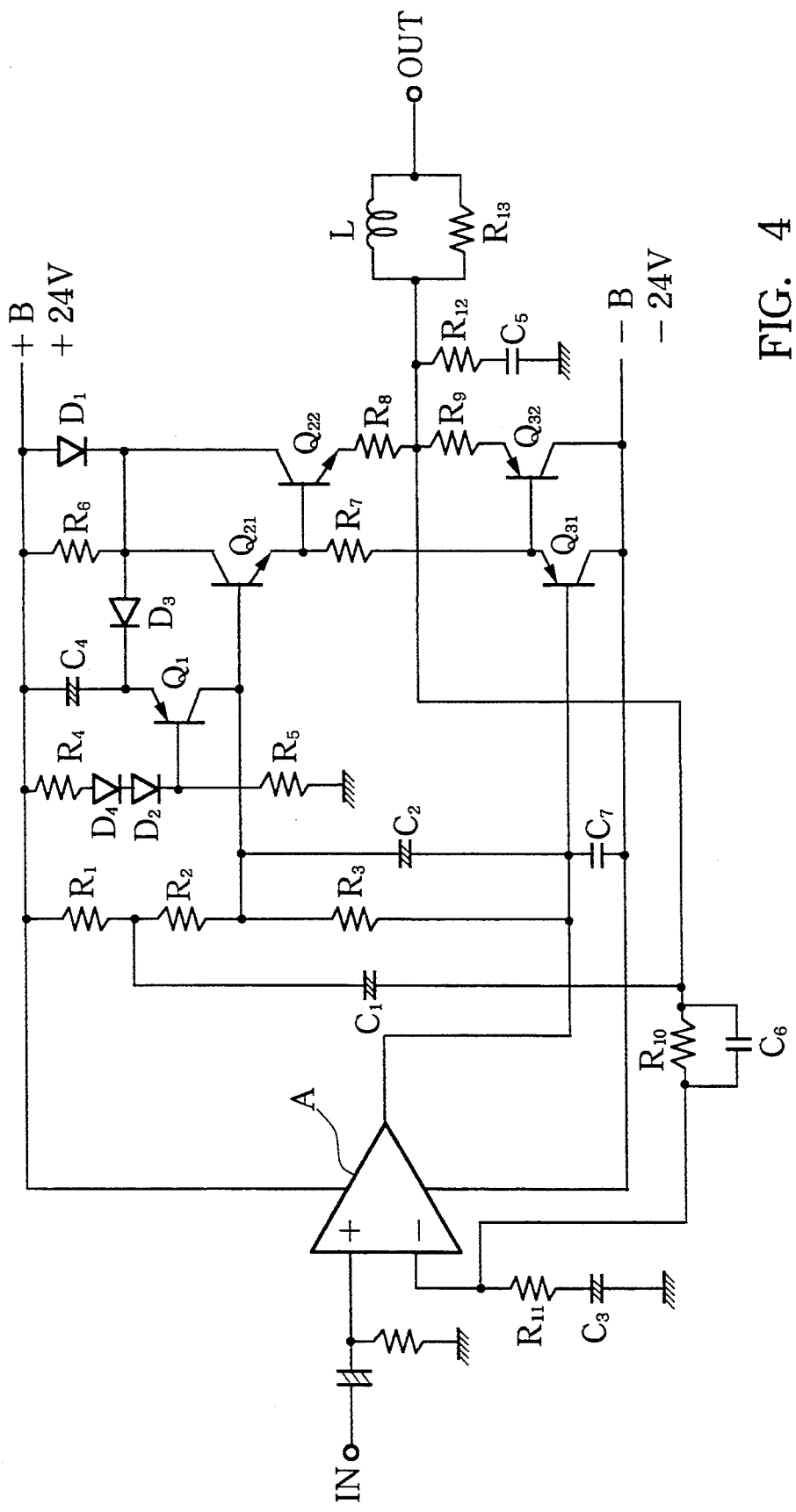
FIG. 4 is a diagram showing a specific circuit of the second embodiment.

FIG. 4 shows a specific amplification circuit of this embodiment. The diode D3 and the capacitor C4 are added to the circuit of FIG. 2 as a distortion reducing circuit. In this specific circuit, a phase correcting capacitors C6 and C7 are provided, and in the output terminal, a load (speaker) phase correcting circuit comprising a resistance R12, a capacitor C5, an inductance L and a resistance R13 is provided.

In the circuit of FIG. 4, an inconvenience may arise under certain conditions. When the amplitude of an output signal is large in the section B in which the output signal becomes a negative half wave, the base current IB and the emitter current IE of the transistors Q31 and Q32 tend to increase thereby causing voltage between the junction of the resistances R8 and R9 and the base of the transistor Q31 to increase and the collector current of the transistor Q22 to decrease. The collector current of the transistor Q1 thereby tend to increase to maintain the collector current of the transistor Q22 constant. As a result, voltage across the capacitor C2 constituting the output stage base bias circuit and having a relatively large capacity increases. This increase in the voltage across the capacitor C2 is not significant in high frequencies but is evident in low frequencies. As a result, when the amplitude decreases subsequently, the idling current may increase due to the increased voltage maintained in the capacitor C2.

There are also cases, such as when clipping occurs due input of a signal of a large amplitude, where overdriving occurs from an amplification circuit in the prior stage whereby the potential at the collector of the transistor Q1 becomes larger than the potential at the emitter thereof. In this case, voltage across the capacitor C4 decreases and, when the amplitude decreases subsequently, the collector current of the transistor Q1 increases with resulting increase in the idling current.

Figure 7:
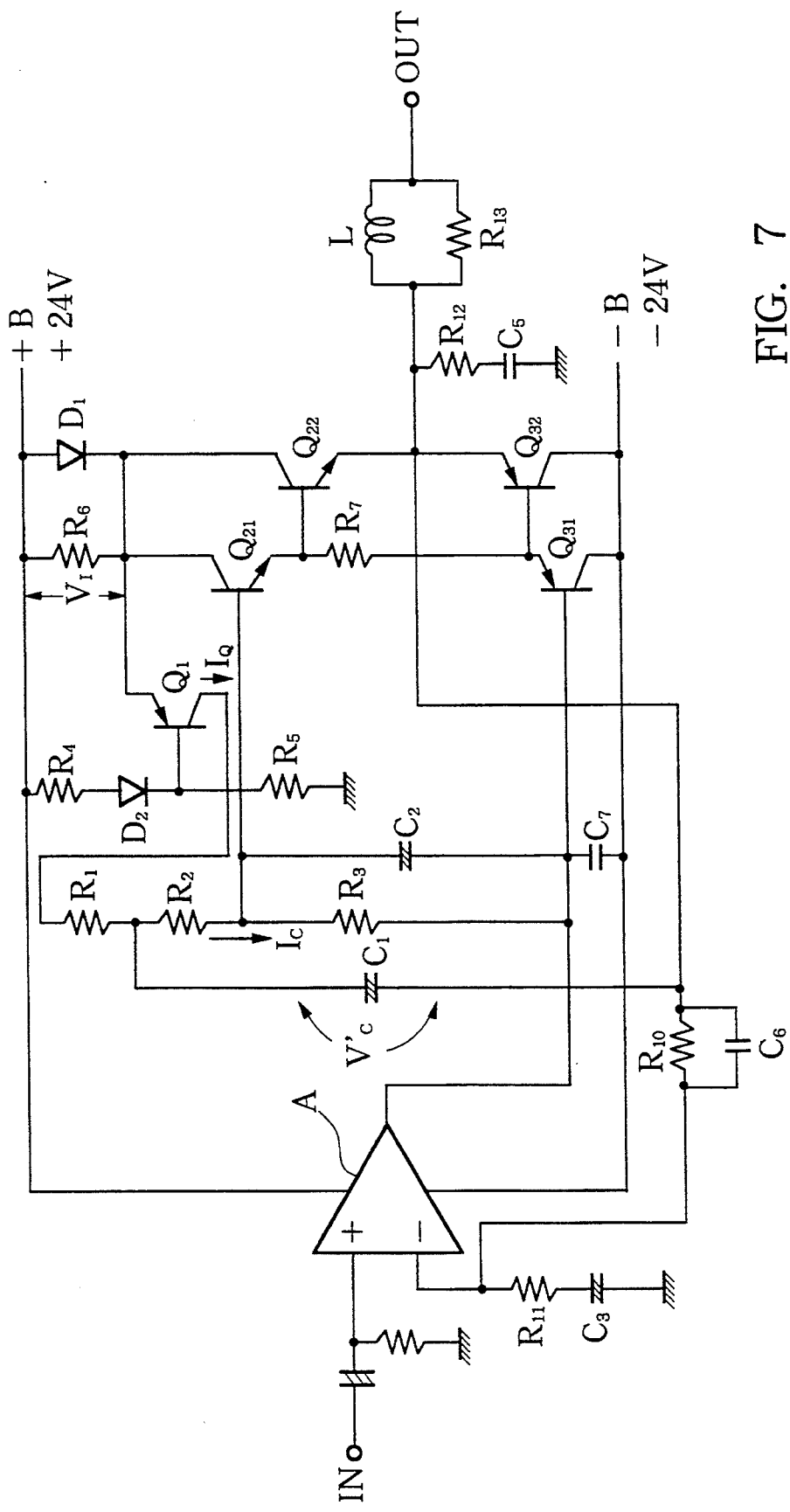
FIG. 7 is a circuit diagram showing a modified circuit of the circuit of the embodiment shown in FIG. 4.

FIG. 7 shows an embodiment for overcoming this problem. In the embodiment, the power source side terminal of resistance R1 is connected to the collector of a transistor Q1. In association with this arrangement, the diodes D3 and D4 and the capacitor C4 in the circuit of FIG. 4 are omitted. The resistances R8 and R9 of the output stage also are omitted. A capacitor C4 in this embodiment is made of a capacitor of a smaller capacity than the corresponding one in FIG. 4.

Figure 8:
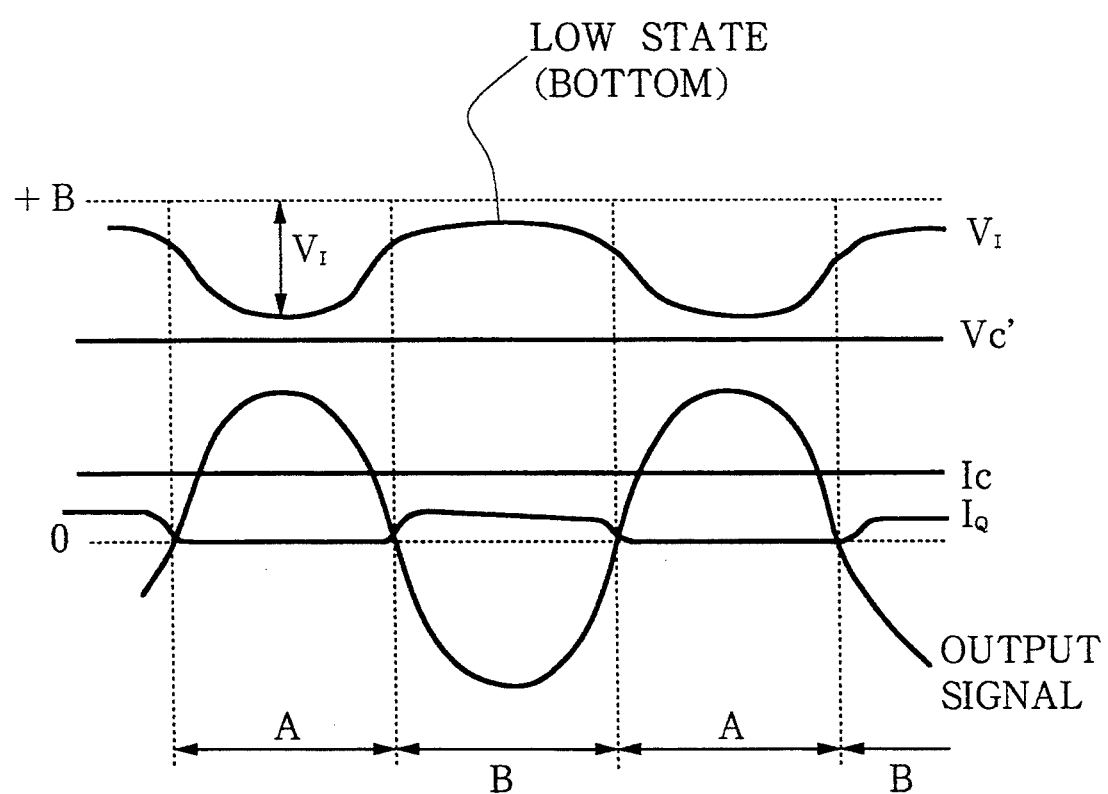
FIG. 8 is a waveform diagram explaining an operation of the circuit of FIG. 7.
Figure 9:
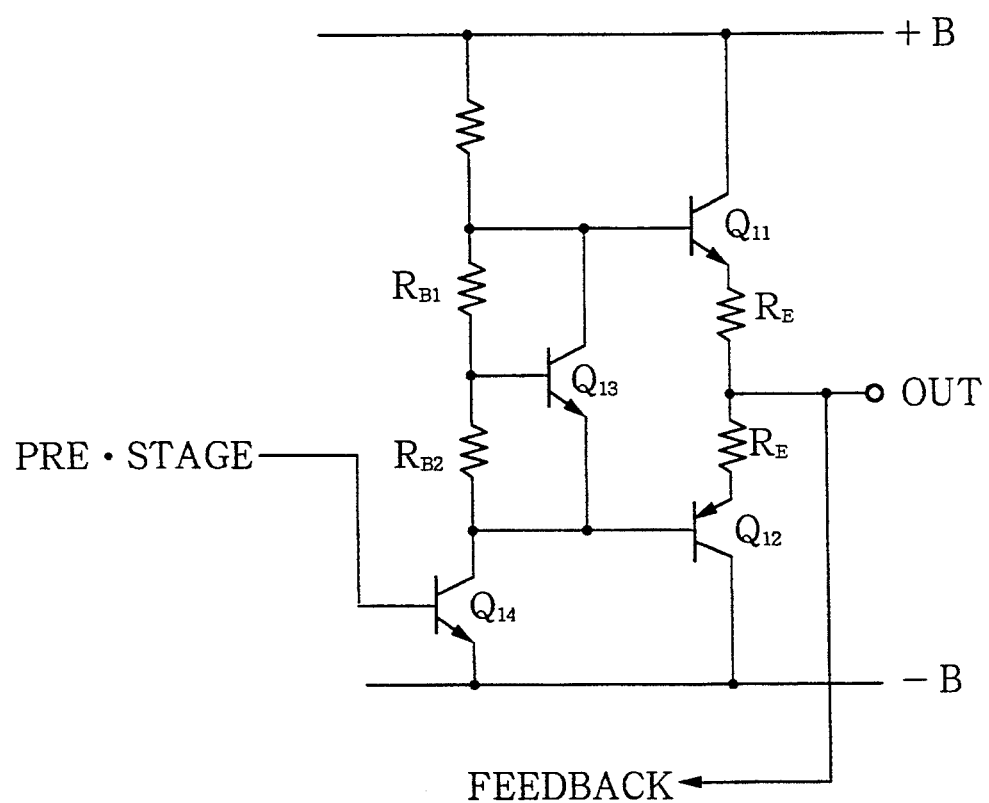
FIG. 9 is a diagram showing the output section of the prior art amplification circuit.

FIG. 8 is a waveform diagram showing the operation waveform of the circuit of this embodiment. In this embodiment, current IQ of the transistor Q1 is determined by the output stage current and this current constitutes a charging current for the capacitor C1 as well as a supply current IC to the bias circuit. In other words, when the idling current decreases, voltage V1 across resistance R6 decrease thereby causing the current IQ of the transistor Q1 to increase. The capacitor is charged with this current IQ and the idling current is negative feedback controlled through a loop starting from and returning to the capacitor C1 through resistance R2, transistor Q21 and transistor Q22.

According to this embodiment, smoothing and holding of the bottom voltage are ensured by the capacitor C1 of a large capacity and, accordingly, the above described undesirable increase in the idling current under special conditions can be effectively prevented.

Application of this invention is not limited to the embodiments as above described. Though in the embodiments, the current detecting resistance is inserted on the positive power source side to perform error amplification and feedback control by using the detected current, it is possible to provide an equivalent circuit on the negative power source side. Also, in this embodiments, one transistor is used for error amplification but such other circuits as a differential amplification circuit and an operational amplification circuit may be used as the error amplification means. These elements may be made by using an integrated circuit. Further, in the embodiments, the output circuit of a general push-pull construction in which the first transistor is npn type and the second transistor is pnp type is used. The invention can be applied also to an amplification circuit of the output circuit type in which the first and the second transistors are both npn type or pnp type and these transistors are driven complementarily.

What is claimed is:

1. An amplification circuit comprising:
   a push-pull type output circuit including first and second output transistors operating complimentarily connected in series between dc current source terminals, each of said first and second transistors includes a base and the bases of each of said first and second transistors are driven by a pre-stage output signal;
   a current detecting resistance inserted between either one of said first and second transistors and one of said dc current source terminals for detecting a bias current of said output circuit;
   error amplification means for amplifying difference between voltage across said current detecting resistance and reference voltage for negative-feedback controlling the bias current of said output circuit independent of said pre-stage output signal; and
   a diode connected in parallel to said current detecting resistance for bypassing a current flowing during outputting of a signal.

2. An amplification circuit as defined in claim 1 further comprising distortion reduction means for charging and holding the voltage across said current detection resistance at its lowest state and thereby smoothing output current of said error amplification means during outputting of a signal.

3. An amplification circuit comprising:
   push-pull type output circuit means for complimentarily operating and outputting a signal, said push-pull type output circuit means connecting in series between dc current source terminals, said circuit means comprising first and second transistors including a base and the bases of each of the first and second transistors are driven by a pre-stage output signal;
   current detecting means for detecting a bias current of said output circuit means between said first transistor and one of said dc current source terminals, the dc current source terminal being located nearer to said first transistor than to said second transistor;
   error amplification means for amplifying difference between voltage detected by said current detecting means and reference voltage and for negative-feedback controlling the bias current of said output means independent of said pre-stage output signal; and
   a diode connected in parallel to said current detecting means for bypassing a current flowing when said push-pull type output circuit means outputs a signal.

4. An amplification circuit as defined in claim 3 further comprising distortion reduction means for charging and holding the voltage detected by said current detecting means at its lowest state and thereby smoothing output current of said error amplification means when said push-pull type output means outputs a signal.

* * * * *